United States Patent
Zhang et al.

(10) Patent No.: US 11,889,745 B2
(45) Date of Patent: Jan. 30, 2024

(54) QLED MANUFACTURING METHOD

(71) Applicant: TCL Technology Group Corporation, Huizhou (CN)

(72) Inventors: Jie Zhang, Huizhou (CN); Chaoyu Xiang, Huizhou (CN)

(73) Assignee: TCL Technology Group Corporation, Huizhou (CN)

( * ) Notice: Subject to any disclaimer, the term of this patent is extended or adjusted under 35 U.S.C. 154(b) by 203 days.

(21) Appl. No.: 17/419,622

(22) PCT Filed: Sep. 17, 2019

(86) PCT No.: PCT/CN2019/106139
§ 371 (c)(1),
(2) Date: Jun. 29, 2021

(87) PCT Pub. No.: WO2020/134204
PCT Pub. Date: Jul. 2, 2020

(65) Prior Publication Data
US 2022/0085293 A1 Mar. 17, 2022

(30) Foreign Application Priority Data
Dec. 29, 2018 (CN) .......................... 201811639626.1

(51) Int. Cl.
*H01L 51/00* (2006.01)
*H10K 71/00* (2023.01)
(Continued)

(52) U.S. Cl.
CPC ............ *H10K 71/311* (2023.02); *H10K 85/60* (2023.02); *H10K 50/115* (2023.02); *H10K 50/16* (2023.02)

(58) Field of Classification Search
CPC ............................ H10K 50/16; H10K 50/115
See application file for complete search history.

(56) References Cited

U.S. PATENT DOCUMENTS

2002/0034656 A1 3/2002 Thompson et al.
2013/0037778 A1 2/2013 Kazlas et al.
(Continued)

FOREIGN PATENT DOCUMENTS

CN 104662691 A 5/2015
CN 105336879 A 2/2016
(Continued)

OTHER PUBLICATIONS

International Search Report for International Application No. PCT/CN2019/106139; Application Filing Date: Sep. 17, 2019; dated Dec. 24, 2019; 6 pages with English Translation.
(Continued)

*Primary Examiner* — Jaehwan Oh

(57) ABSTRACT

The present application discloses a QLED manufacturing method including: providing a substrate provided with an electron transport layer; depositing a solution on a surface of the electron transport layer, standing until the electron transport layer is infiltrated, and then performing a drying operation, wherein the solution includes a main solvent and a solute dissolved in the main solvent, a polarity of the solute is greater than a polarity of the main solvent, and the solution is not able to dissolve the electron transport material in the electron transport layer; preparing other film layers on the electron transport layer processed by the mixed solvent to prepare the QLED, such that the QLED at least includes: an anode and a cathode arranged oppositely, a quantum dot light emitting layer arranged between the anode and the cathode, and the electron transport layer between the quantum dot light emitting layer and the cathode.

20 Claims, 1 Drawing Sheet

(51) Int. Cl.
*H10K 85/60* (2023.01)
*H10K 50/16* (2023.01)
*H10K 50/115* (2023.01)

(56) References Cited

U.S. PATENT DOCUMENTS

| | | |
|---|---|---|
| 2013/0328019 A1 | 12/2013 | Xia et al. |
| 2014/0131676 A1 | 5/2014 | Beers et al. |
| 2014/0197386 A1 | 7/2014 | Kim et al. |
| 2015/0171349 A1 | 6/2015 | Ma et al. |
| 2016/0133860 A1 | 5/2016 | Boudreault et al. |
| 2017/0221969 A1 | 8/2017 | Steckel et al. |
| 2018/0233688 A1 | 8/2018 | Chen et al. |
| 2018/0358560 A1 | 12/2018 | Huang |
| 2019/0375956 A1* | 12/2019 | Pan ............... H10K 85/342 |
| 2020/0028090 A1* | 1/2020 | Zhang ............... H10K 50/11 |
| 2021/0408416 A1* | 12/2021 | Angioni ............ C09K 11/025 |
| 2021/0408417 A1* | 12/2021 | Angioni ............ H10K 50/16 |
| 2022/0037604 A1* | 2/2022 | Utsumi ............. H05B 33/10 |

FOREIGN PATENT DOCUMENTS

| | | |
|---|---|---|
| CN | 105355799 A | 2/2016 |
| CN | 105514281 A | 4/2016 |
| CN | 106206972 A | 12/2016 |
| CN | 106585157 A | 4/2017 |
| CN | 107046047 A | 8/2017 |
| CN | 108232042 A | 6/2018 |
| CN | 108346679 A | 7/2018 |
| CN | 108624137 A | 10/2018 |
| CN | 108987596 A | 12/2018 |
| CN | 108987600 A | 12/2018 |
| JP | 2008124128 A | 5/2008 |
| JP | 2008124138 A | 5/2008 |
| JP | 2011017042 A | 1/2011 |
| WO | 2018192334 A1 | 10/2018 |
| WO | 2020134204 A1 | 7/2020 |

OTHER PUBLICATIONS

Written Opinion for International Application No. PCT/CN2019/1061239; Application Filing Date: Sep. 17, 2019; dated Dec. 24, 2019; 4 pages.
Extended European Search Report dated Jan. 21, 2022; EP Application No. 19905846.2; 7 pages.
First Office Action dated Nov. 4, 2020; CN Application No. 201811639626.1; 3 pages (non-English).
First Office Action dated Nov. 4, 2020; CN Application No. 201811639626.1; 5 pages (English).
Notification of Grant dated Mar. 4, 2021; CN Application No. 201811639626.1; 1 page (non-English).
Notification of Grant dated Mar. 4, 2021; CN Application No. 201811639626.1; 2 pages (English).
Search dated Oct. 27, 2020; CN Application No. 201811639626.1; 2 pages.
Hoshi, K. et al. "Purification of Perovskite Quantum Dots Using Low-Dielectric-Constant Washing Solvent Diglyme for Highly Efficient Light-Emitting Devices" ACS Appl. Mater. Interfaces, Jul. 3, 2018.
Gui Youn Park et al., Iridium Complexes Containing Three Different Ligands as White OLEO Dopants, Molecular Crystals and Liquid Crystals, pp. 179-188, vol. 462.
Ilwan Jang et al., Study of Ethanolamine Surface Treatment on the Metal-Oxide Electron Transport Layer in Inverted InP Quantum Dot Light-Emitting Diodes, Electronic Materials Letters, pp. 1066-1071, vol. 11, No. 6.
Marc Lepeltier et al., Tris-cyclometalated Iridium(III) Complexes with Three Different Ligands: a New Example with 2-(2,4-Difluorophenyl)pyridine-Based Complex, Helvetica Chimica Acta, pp. 939-956, vol. 97.
Jia-Ling Liao et al., Ir(III)-Based Phosphors with Bipyrazolate Ancillaries; Rational Design, Photophysics, and Applications in Organic Light-Emitting Diodes, Inorganic Chemistry, Nov. 3, 2015, pp. 10811-10821, 2015, 54.

* cited by examiner providing a substrate provided with an electron transport layer, wherein the substrate provided with the electron transport layer comprises: an anode substrate, a quantum dot light emitting layer provided on the anode substrate, and the electron transport layer provided on a side of the quantum dot light emitting layer facing way from the anode substrate; wherein the substrate provided with the electron transport layer further comprises a cathode substrate, and the electron transport layer is provided on the cathode substrate;

depositing a solution on a surface of the electron transport layer, standing until the electron transport layer is infiltrated by the solution, and then performing a drying operation, wherein the solution comprises a main solvent and a solute dissolved in the main solvent, a polarity of the solute is greater than a polarity of the main solvent, and the solution is not able to dissolve an electron transport material in the electron transport layer.

QLED MANUFACTURING METHOD

CROSS REFERENCE TO RELATED APPLICATIONS

The present application is a 35 U.S.C. § 371 National Stage Application of PCT Application Serial No. PCT/CN2019/106139 filed on Sep. 17, 2019, which claims the benefit of Chinese Patent Application Serial No. 201811639626.1 filed with the Chinese Patent Office on Dec. 29, 2018 and entitled "QLED MANUFACTURING METHOD", the contents each of which are incorporated herein by reference in their entity.

TECHNICAL FIELD

The present application relates to the field of display technologies, and particularly relates to a QLED manufacturing method.

BACKGROUND

Quantum dots, also referred to as semiconductor nanocrystals, have three-dimensional dimensions in a nanometer range (from 1 nm to 100 nm), and are a kind of nanoparticle theory between bulk materials and molecules. Quantum dots are provided with excellent optical properties such as high quantum yield, large molar extinction coefficient, good light stability, narrow half-peak width, wide excitation spectrum and controllable emission spectrum etc., and are very suitable for use as a luminescent material for light-emitting devices. In recent years, quantum dot fluorescent materials have been widely used in the field of pad displays due to their advantages such as high light and color purity, adjustable luminous colors, and long service life etc., thereby becoming an extremely promising next-generation display and solid-state lighting source. QLED (Quantum Dot Light Emitting Diode) is a light emitting device on the condition that the quantum dot material is used as the luminescent material, and it has become a strong competitor in the display technologies of a next generation due to its advantages such as adjustable wavelength, narrow emission spectrum, high stability, and high electroluminescence quantum yield, etc However, the current QLED manufacturing methods still needs to be improved.

Technical Problem

Inventors found that, a basic structure of the QLED device includes an anode and a cathode disposed oppositely, and a quantum dot light emitting layer disposed between the anode and the cathode. In order to balance carrier transport performance of the QLED device, a hole functional layer is introduced between the quantum dot light emitting layer and the electrode. Generally, an electron transport layer is provided between the quantum dot light emitting layer and the cathode. During manufacture of the QLED device, impurities will be introduced into the electron transport layer inevitably, and the impurities will affect luminous efficiency and service life of the QLED. One objective of embodiments of the present application is to provide a QLED manufacturing method, which aims to solve the problem that impurities in the electron transport layer of the QLED affect the luminous efficiency and service life of the QLED.

SUMMARY

In order to solve the above technical problem, technical solutions are adopted by embodiments of the present application are as follows.

A first aspect, a QLED manufacturing method is provided, which includes following steps of:
  providing a substrate provided with an electron transport layer, wherein the substrate provided with the electron transport layer comprises: an anode substrate, a quantum dot light emitting layer provided on the anode substrate, and the electron transport layer provided on a side of the quantum dot light emitting layer facing way from the anode substrate;
  depositing a solution on a surface of the electron transport layer, standing until the electron transport layer is infiltrated by the solution, and then performing a drying operation, wherein the solution comprises a main solvent and a solute dissolved in the main solvent, a polarity of the solute is greater than a polarity of the main solvent, and the solution is not able to dissolve an electron transport material in the electron transport layer; or,
  providing a substrate provided with an electron transport layer, wherein the substrate provided with the electron transport layer includes a cathode substrate, and the electron transport layer provided on the cathode substrate;
  depositing a solution on a surface of the electron transport layer, standing until the electron transport layer is infiltrated by the solution, and then performing a drying operation, wherein the solution comprises a main solvent and a solute dissolved in the main solvent, a polarity of the solute is greater than a polarity of the main solvent, and the solution is not able to dissolve an electron transport material in the electron transport layer.

In an embodiment, the main solvent is selected from one or more than two of a group comprising alkanes and their derivatives with a carbon atom number less than 20 in a straight chain, cycloalkanes and their derivatives with a carbon atom number less than 20, olefins and their derivatives with a carbon atom number less than 20 in a straight chain, and esters and their derivatives with a carbon atom number less than 20 in a straight chain.

In an embodiment, the main solvent selected from alkanes and their derivatives with the carbon atom number less than 20 in the straight chain is selected from one or more of n-hexane, n-heptane, 1-octane, 3-methylheptane and 1-chlorohexane;
  the cycloalkane and their derivatives with the carbon atom number less than 20 are selected from one or more of cyclohexane, 2-methylcyclohexane, cycloheptane and cyclohexylacetic acid;
  the esters and their derivatives with the carbon atom number less than 20 in the straight chain are selected from one or more of ethyl acetate, ethyl butyrate, and ethyl mandelate;
  the olefins and their derivatives with the carbon atom number less than 20 in the straight chain are selected from one or more of 3-hexene, 4-octene, 5-decene, 5-methyl-5-decene and 9-octadecenoic acid.

In an embodiment, the solute is selected from one or more than two of a group of mercaptans with a carbon atom number less than 20 in a straight chain, organic acids with a carbon atom number less than 15 in a straight chain, halogenated hydrocarbons with a carbon atom number less than 20 in a straight chain, amino acids and organic bases.

In an embodiment, the mercaptans with the carbon atom number less than 20 in the straight chain are selected from one or more of butanethiol, pentanethiol, heptanethiol, octanethiol, and octadecanethiol;

the organic acids and their derivatives with the carbon atom number less than 15 in the straight chain are selected from one or more of tetradecanoic acid, perfluorooctanoic acid, perchloro-decyl carboxylic acid and perfluorododecanoic acid;

the halogenated hydrocarbons with the carbon atom number less than 20 in the straight chain are selected from one or more of 1-fluoropropane, 1-chlorobutane, 1-chlorohexane and 3-fluorohexane.

the amino acids are selected from one or more of glycine, serine, cysteine, and isoleucine;

the organic bases are selected from one or more of ethanolamine, diethanolamine, triethanolamine, and tetramethylammonium hydroxide.

In an embodiment, based on a total weight of the solution being 100%, a weight percentage of the solute is from 0.0001% to 1%.

In an embodiment, based on the total weight of the solution being 100%, the weight percentage of the solute is from 0.0001% to 0.5%.

In an embodiment, the solution is deposited on the surface of the electron transport layer, and the standing is performed under a condition where a temperature is from 10° C. to 1860° C. until the electron transport layer is infiltrated, and then the drying operation is performed.

In an embodiment, the solution is deposited on the surface of the electron transport layer, and the standing is performed until the electron transport layer is infiltrated, and then the drying operation is performed by vacuumizing.

In an embodiment, the vacuumizing is performed under a condition of a vacuum degree of 8 Pa-200 Pa.

In an embodiment, the solution is deposited on the surface of the electron transport layer, and the standing is performed for 10 minutes to 100 minutes until the electron transport layer is infiltrated, and then the drying operation is performed.

In an embodiment, the substrate provided with the electron transport layer comprises: the anode substrate, the quantum dot light emitting layer provided on the anode substrate, and the electron transport layer disposed on the side of the quantum dot light emitting layer facing away from the anode substrate.

In an embodiment, the method further comprises a step of preparing a hole functional layer on a surface of the anode, wherein the hole functional layer comprises at least one of a hole injection layer, a hole transport layer and an electron blocking layer.

In an embodiment, the substrate provided with the electron transport layer comprises: the cathode substrate, and the electron transport layer provided on the cathode substrate. At this time, the substrate provided with the electron transport layer may be prepared by the following method: providing a substrate provided with a cathode, that is, a cathode substrate, and preparing an electron transport layer on a surface of the cathode.

In an embodiment, before preparing the electron transport layer, at least one of an electron injection layer and a hole blocking layer is prepared on a surface of the cathode.

The beneficial effect of the QLED manufacturing method provided by the embodiments of the present application lies in that: the solution is deposited on the surface of the electron transport layer, wherein the solution includes the main solvent and the solute dissolved in the main solvent, the polarity of the solute is less than or equal to the polarity of the main solvent, and the solution is not able to dissolve the electron transport material in the electron transport layer. The solution is infiltrated on the surface of the electron transport layer, the solute is adsorbed on the film surface of the electron transport layer through the interface with two phases of solid and liquid, and the impurities remaining in the electron transport layer are dissolved and removed by the subsequent heating operation, thereby improving the luminous efficiency and service life of the QLED.

DESCRIPTION OF THE DRAWINGS

In order to more clearly illustrate the technical solutions in the embodiments of the present application, drawings needed to be used in description for the embodiments or exemplary technologies will be briefly introduced below. Obviously, the drawings in the following description are only some embodiments of the present application, and other drawings may be obtained by those of ordinary skill in the art based on these drawings without creative work.

FIG. 1 is a flowchart of a QLED manufacturing method according to an embodiment of the present application.

DETAILED EMBODIMENTS

In order to make the objectives, technical solutions, and advantages of the present application more comprehensible, the present application is further described in detail below with reference to the accompanying drawings and embodiments. It should be understood that the specific embodiments described herein are only used to explain the present application, and are not aimed to limit the present application.

It should be noted that the terms "first" and "second" are only used for a descriptive purpose, and cannot be understood as an indication or implication of relative importance or an implicit indication of the number of a specific technical feature. Therefore, the features defined with "first" and "second" may explicitly or implicitly include one or more of these features. In the description of the present application, "plurality" means two or more than two, unless otherwise specifically defined.

In order to illustrate the technical solutions of the present application, the present application will be described in detail below in conjunction with specific drawings and embodiments.

As shown in FIG. 1, some embodiments of the present application provide a QLED manufacturing method, which includes following steps of:

at step S01, providing a substrate provided with an electron transport layer, here the substrate provided with the electron transport layer includes an anode substrate, a quantum dot light emitting layer provided on the anode substrate, and the electron transport layer provided on a side of the quantum dot light emitting layer facing away from the anode substrate; or, providing a substrate provided with an electron transport layer, here the substrate provided with the electron transport layer includes a cathode substrate, and the electron transport layer provided on the cathode substrate;

at step S02, depositing a solution on a surface of the electron transport layer, standing until the electron transport layer is infiltrated by the solution, and then performing a drying operation, here the solution includes a main solvent and a solute dissolved in the main solvent, the a polarity of the solute is greater than a polarity of the main solvent, and the solution does not dissolve an electron transport material in the electron transport layer;

at step S03, preparing other film layers on the electron transport layer treated with the mixed solvent to prepare a QLED, such that the QLED at least include following structures: the anode and cathode oppositely arranged, the quantum dot light emitting layer arranged between the anode and the cathode, and the electron transport layer arranged between the quantum dot light emitting layer and the cathode.

In the QLED manufacturing method provided by this embodiment of the present application, the solution is deposited on the surface of the electron transport layer, the solution includes the main solvent and the solute dissolved in the main solvent, the polarity of the solute is less than or equal to the polarity of the main solvent, and the solution does not dissolve the electron transport material in the electron transport layer. The solution infiltrates the surface of the electron transport layer, the solute is adsorbed on the film surface of the electron transport layer via an interface provided with two phases of solid and liquid and dissolves impurities remaining in the electron transport layer, and the impurities are removed by a subsequent heating operation thereby improving the luminous efficiency and service life of the QLED.

Specifically, in the above step S01 of providing the substrate provided with the electron transport layer, the substrate of the electron transport layer includes two situations.

As an implementation, the substrate provided with the electron transport layer includes: the anode substrate, the quantum dot light emitting layer provided on the anode substrate, and the electron transport layer provided on one side of the quantum dot light emitting layer facing away from the anode substrate. At this time, the substrate provided with the electron transport layer may be prepared by a following method: providing the substrate provided with the anode, that is, the anode substrate, preparing the quantum dot light emitting layer on a surface of the anode, and preparing the electron transport layer on the surface of the quantum dot light emitting layer.

Here, the anode substrate includes the substrate and the anode provided on the substrate. There is no strict limitation on choice of the substrate, which may adopt a hard substrate such as a glass substrate, or a flexible substrate such as a polyimide substrate and a polynorbornene substrate, but it is not limited thereto. In some embodiments, the anode may be selected as ITO, but it is not limited thereto.

In some embodiments, a solution processing method is used to deposit a quantum dot solution on the anode to prepare the quantum dot light emitting layer. In some embodiments of the present application, an inkjet printing method is used to deposit quantum dot ink on the bottom electrode to prepare the quantum dot light emitting layer. In an embodiment of the present application, the quantum dots in the quantum dot light emitting layer are conventional quantum dots in the art. In some embodiments, the thickness of the quantum dot light emitting layer is from 20 nm to 50 nm.

In some embodiments, the solution processing method is used to prepare the electron transport layer on the surface of the quantum dot light emitting layer. The material of the electron transport layer may be a conventional electron transport material, including but not limited to n-type zinc oxide, and the thickness of the electron transport layer is from 10 nm to ~100 nm.

On the basis of the foregoing embodiments, in order to obtain better device performance, other functional layers may be introduced.

In some embodiments, a step of preparing a hole functional layer on a surface of the anode (the hole functional layer is disposed between the anode and the quantum dot light emitting layer) is included. The hole functional layer includes at least one of a hole injection layer, a hole transport layer, and an electron blocking layer. Among them, the hole injection layer and the hole transport layer are configured to reduce difficulty in hole injection, and the electron blocking layer is configured to block excess electrons, so that the excess electrons cannot reach the anode to form a leakage current, thereby improving he current efficiency of the QLED. In some embodiments of the present application, on the condition that the anode is disposed on the substrate to form the anode substrate, the method, before preparing the quantum dot light emitting layer, further includes a step of: preparing the hole injection layer on a surface of the anode of the substrate, and preparing the hole transport layer on a side of the hole injecting layer facing away from the anode. Here, a material of the hole injection layer may be a conventional hole injection material, including but not limited to PEDOT:PSS. A material of the hole transport layer may be a conventional hole transport material, including but not limited to an organic material such as NPB, TFB, etc., and an inorganic material such as NiO, MoO3, etc., and a composite thereof. The thickness of the hole transport layer is from 10 nm to 100 nm.

As another implementation, the substrate provided with the electron transport layer includes a cathode substrate, and the electron transport layer provided on the cathode substrate. At this time, the substrate provided with the electron transport layer may be prepared by a following method: providing a substrate provided with a cathode, that is, the cathode substrate, and preparing the electron transport layer on a surface of the cathode.

Here, the cathode substrate includes the substrate and the cathode disposed on the substrate. The selection of the substrate is as described above. In some embodiments, the cathode may be a metal electrode, including but not limited to a silver electrode and an aluminum electrode. The thickness of the cathode is from 30 nm to 120 nm, and is 100 nm in some embodiments of the present application.

In some embodiments, the solution processing method is used to prepare the electron transport layer on the surface of the cathode. The material and thickness of the electron transport layer are as described above.

On the basis of the foregoing embodiments, in order to obtain better device performance, other functional layers may be introduced.

In some embodiments, before preparing the electron transport layer, at least one of the electron injection layer and the hole blocking layer is prepared on a surface of the cathode. Among them, the electron injection layer and the electron transport layer are configured to reduce difficulty in electron injection, and the hole blocking layer is configured to block excess holes, so that the excess holes cannot reach the cathode to form a leakage current, thereby improving the current efficiency of the QLED. In some embodiments of the present application, the method, before preparing the electron transport layer, further includes: preparing the electron injection layer on the surface. The material of the electron injection layer may be a conventional electron hole injection material, including but not limited to LiF and CsF, and the thickness of the electron transport layer is from 10 nm to 100 nm. The material of the electron transport layer may be a conventional electron transport material, including but not limited to n-type zinc oxide, and the thickness of the electron transport layer is from 10 nm to 100 nm.

In the above step S02, the solution is deposited on the surface of the electron transport layer, and it is standed so that the solute in the solution is adsorbed on the film surface of the electron transport layer via the interface with two phases of solid and liquid, and the impurities remaining in the electron transport layer are dissolved and then removed by the subsequent heating operation, thereby improving the luminous efficiency and service life of the QLED.

In the embodiments of the present application, the solution does not dissolve the electron transport material in the electron transport layer. Specifically, the solution includes the main solvent and the solute dissolved in the main solvent, and the main solvent does not dissolve the electron transport material in the electron transport layer.

In some embodiments, the main solvent is selected from one or more than two of a group including alkanes and their derivatives with a carbon atom number less than 20 in a straight chain, cycloalkanes and their derivatives with a carbon atom number less than 20, olefins and their derivatives with a carbon atom number less than 20 in a straight chain, and esters with a carbon atom number less than 20 in a straight chain. The above-mentioned solvent can provide a mild liquid phase environment for second film formation of the functional layers, and is an excellent medium for improving the functional layers.

In some embodiments, the main solvent selected from alkanes and their derivatives with the carbon atom number less than 20 in the straight chain is selected from one or more of n-hexane, n-heptane, 1-octane, 3-methylheptane and 1-chlorohexane. In some embodiments, the cycloalkane and their derivatives with the carbon atom number less than 20 are selected from one or more of cyclohexane, 2-methylcyclohexane, cycloheptane and cyclohexylacetic acid. In some embodiments, the esters and their derivatives with the carbon atom number less than 20 in the straight chain are selected from one or more of ethyl acetate, ethyl butyrate, and ethyl mandelate. In some embodiments, the olefins and their derivatives with the carbon atom number less than 20 in the straight chain are selected from one or more of 3-hexene, 4-octene, 5-decene, 5-methyl-5-decene and 9-octadecenoic acid. The above-mentioned solvents can provide a mild liquid phase environment for the second film formation of the functional layers, and is an excellent medium for improving the functional layers.

In the embodiments of the present application, the polarity of the solute is greater than the polarity of the main solvent. The solute may provide certain solubleness for the electron transport material in the electron transport layer, but it will not cause dissolution of the electron transport material in the electron transport layer after it is mixed with the main solvent to form the solution.

In some embodiments, the solute is selected from one or more than two of a group of mercaptans with a carbon atom number less than 20 in a straight chain, organic acids with a carbon atom number less than 15 in a straight chain, halogenated hydrocarbons with a carbon atom number less than 20 in a straight chain, amino acids and organic bases. The above-mentioned solutes have the effect of improving the film formation of the functional layers of the device and improving the efficiency of the device.

In some embodiments, the mercaptans with the carbon atom number less than 20 in the straight chain are selected from one or more of butanethiol, pentanethiol, heptanethiol, octanethiol, and octadecanethiol. In some embodiments, the organic acids with the carbon atom number less than 15 in the straight chain are selected from one or more of perfluorooctanoic acid, perfluoro-decyl phosphonic acid, perchlorodecyl carboxylic acid and perfluorododecanoic acid. In some embodiments, the halogenated hydrocarbons with the carbon atom number less than 20 in the straight chain are selected from one or more of 1-fluoropropane, 1-chlorobutane, 1-chlorohexane and 3-fluorohexane. In some embodiments, the amino acids are selected from one or more of glycine, serine, cysteine, and isoleucine. In some embodiments, the organic bases are selected from one or more of ethanolamine, diethanolamine, triethanolamine, and tetramethylammonium hydroxide. The above-mentioned solutes have the effect of improving the film formation of the functional layers of the device and improving the efficiency of the device. The solute in an embodiment of the present application is relatively small and does not exceed 1% of a total weight of the solution, as such the formed overall solution has no effect on the electron transport material in the electron transport layer. In some embodiments, based on the total weight of the solution being 100%, the weight percentage of the solute is from 0.0001 to 1%. If the solution contains the solute with low polarity too much, then part of the electron transport material in the electron transport layer maybe be dissolved, thereby affecting the function of the electron transport layer. In some embodiments of the present application, based on the total weight of the solution being 100%, the weight percentage of the solute is from 0.0001 to 0.5%.

In some embodiments, in the step of depositing the solution on the surface of the electron transport layer, standing until the electron transport layer is infiltrated and then performing the drying operation, after the surface of the electron transport layer is deposited with the solution, it is standed under a condition where a temperature is from 10° to 60° C. This temperature range facilitates absorption of the solute on the surface of the electron transport layer via the interface with two phases of solid and liquid, and dissolution of impurities remaining in the electron transport layer, and subsequent removal through heating operation. At the same time, this will not affect the materials of the electron transport layer or other functional layers that have been formed.

In some embodiments, in the step of depositing the solution on the surface of the electron transport layer, standing until the electron transport layer is infiltrated and then performing the drying operation, the components of the solution are removed by a vacuuming process. In some embodiments of the present application, the vacuuming process is performed under a condition where a vacuum degree is from 8 Pa to 200 Pa, so as to improve the luminous efficiency of the QLED without affecting its service life. In some embodiments of the present application, the vacuuming process is performed under a condition where a vacuum degree is from 8 Pa to 100 Pa.

In some embodiments, in the step of depositing the solution on the surface of the electron transport layer, standing until the electron transport layer is infiltrated and then performing the drying operation, the heating and drying are performed under a condition where a temperature is from 10° C. to 180° C., so as to remove the deposited solution as well as the impurities originally remaining in the electron transport layer and dissolved in the solution, especially the remaining reagents.

In some embodiments, in the step of depositing the solution on the surface of the electron transport layer, standing until the electron transport layer is infiltrated and then performing the drying operation, the standing time is from 10 minutes to 100 minutes. During this time, the effect of removing the impurities in the electron transport layer through solution infiltration is significant, and other properties of the QLED will not be affected due to the long time.

In the above step S03, other film layers are prepared on the electron transport layer processed with the mixed solvents to prepare the QLED, such that the QLED at least includes the following structures: the anode and the cathode that are arranged oppositely, the quantum dot light emitting layer arranged between the anode and the cathode, and the electron transport layer arranged between the quantum dot light emitting layer and the cathode.

As an implementation, when the substrate provided with the electron transport layer includes the anode substrate, the quantum dot light emitting layer provided on the anode substrate and the electron transport layer arranged on a side of the quantum dot light emitting layer facing away from the anode substrate, the cathode is prepared on a side of the electron transport layer facing away from the anode, and the selection of the cathode is as described above.

In some embodiments of the present application, before preparing the cathode, an electron injection layer is prepared on the side of the electron transport layer facing away from the anode, and the selection of the electron injection layer is as described above.

As another implementation, when the substrate provided with the electron transport layer includes the cathode substrate and the electron transport layer provided on the cathode substrate, the quantum dot light emitting layer is prepared on a side of the electron transport layer facing away from the cathode, and the anode is prepared on a surface of the quantum dot light emitting layer facing away from the cathode. The selection of the quantum dot light emitting layer and the anode are as described above.

In some embodiments, after the hole blocking layer is prepared on the side of the electron transport layer facing away from the cathode, the quantum dot light emitting layer is prepared. The selection of the hole blocking layer is as described above.

In some embodiments, after the hole functional layer is prepared on the surface of the quantum dot light emitting layer facing away from the cathode, the anode is prepared. The selection of the hole functional layer is as described above.

The description will be given below in conjunction with specific embodiments.

First Embodiment

A QLED manufacturing method, may include the following steps of:

providing a glass substrate provided with an anode (ITO), preparing a hole injection layer (PEDOT:PSS) on the anode, preparing a hole transport layer (TFB) on a side of the hole injection layer facing away from the anode, preparing a quantum dot light emitting layer (CdSe/ZnS QDs) on a side of the hole transport layer facing away from the anode, and preparing an electron transport layer (ZnO) on a side of the quantum dot light emitting layer facing away from the anode;

depositing a heptane solution with a poly-1-butanethiol content of 100 ppm and a triethanolamine content of 1000 ppm on a surface of the electron transport layer, and then vacuumizing after it is standed at a room temperature for 20 minutes to remove residual solution components;

preparing an electron injection layer (LiF) on the surface of the electron transport layer facing away from the anode, and preparing an aluminum cathode on a surface of the electron injection layer facing away from the anode.

Second Embodiment

A QLED manufacturing method differs from the first embodiment in that: a heptane solution with a poly-1-butanethiol content of 500 ppm and a triethanolamine content of 5000 ppm is deposited on the surface of the electron transport layer, and vacuumizing is performed after it is standed at the room temperature for 20 minutes to remove residual solution components.

First Comparative Example

A QLED manufacturing method differs from the first embodiment in that: n-heptanes are deposited on the surface of the electron transport layer, and vacuumizing is performed after it is standed at the room temperature for 20 minutes to remove the residual solution components.

Second Comparative Example

A QLED manufacturing method differs from the first embodiment in that: the electron injection layer (LiF) is directly prepared on the surface of the prepared electron transport layer facing away from the anode, and the aluminum cathode is prepared on the surface of the electron injection layer facing away from the anode. That is, the step of "depositing a heptane solution with a poly-1-butanethiol content of 100 ppm and a triethanolamine content of 1000 ppm on the surface of the electron transport layer, and then vacuumizing after it is standed at a room temperature for 20 minutes to remove residual solution components" is not performed.

The changes of external quantum efficiency (%) of the QLEDs prepared in first and second embodiments and first and second comparative examples are tested after they are powered on and cured, and the results are shown in Table 1 below.

TABLE 1

| external quantum efficiency (%) | solution composition 1 $m_{1\text{-}Butanethiol}$ | solution composition 2 $m_{Triethanolamine}$ | after 1 day | after 2 days | after 3 days | after 4 days |
|---|---|---|---|---|---|---|
| first embodiment | 100 ppm | 1000 ppm | 2.4 | 4.2 | 5.6 | 6.5 |
| second embodiment | 500 ppm | 5000 ppm | 2.8 | 4.9 | 6.0 | 6.7 |
| first comparative example | 0 ppm | 0 ppm | 3.1 | 4.0 | 4.5 | 4.5 |
| first comparative example | — | — | 3.0 | 4.7 | 5.9 | 5.5 |

It can be seen from the above Table 1 that, after the heptane solution with a certain amount of poly-1-butanethiol and triethanolamine is deposited on the surface of the electron transport layer, and vacuumizing and drying are performed, the external quantum efficiency of the QLED can be improved to a certain extent.

Third Embodiment

A QLED manufacturing method includes the following steps of:

providing a glass substrate provided with an anode (ITO), preparing a hole injection layer (PEDOT:PSS) on the anode, preparing a hole transport layer (TFB) on a side of the hole injection layer facing away from the anode, preparing a quantum dot light emitting layer (CdSe/ZnS QDs) on a side of the hole transport layer facing away from the anode, and preparing an electron transport layer (ZnO) on a side of the quantum dot light emitting layer facing away from the anode;

depositing a hexane solution with a poly-1-butanethiol content of 100 ppm and a triethanolamine content of 1000 ppm on a surface of the electron transport layer, and vacuumizing under a condition of a vacuum degree of 8 Pa after it is standed for 20 minutes at a room temperature to remove residual solution components;

Preparing an electron injection layer (LiF) on the surface of the electron transport layer facing away from the anode, and preparing an aluminum cathode on a surface of the electron injection layer facing away from the anode.

Fourth Embodiment

A QLED manufacturing method differs from the third embodiment in that: the hexane solution with a poly-1-butanethiol content of 100 ppm and a triethanolamine content of 1000 ppm is deposited on the surface of the electron transport layer, and vacuumizing is performed under a condition of a vacuum degree of 40 Pa after it is standed for 20 minutes at a room temperature to remove the residual solution components.

Fifth Embodiment

A QLED manufacturing method differs from the third embodiment in that: the hexane solution with a poly-1-butanethiol content of 100 ppm and a triethanolamine content of 1000 ppm is deposited on the surface of the electron transport layer, and vacuumizing is performed under a condition of a vacuum degree of 200 Pa after it is standed for 20 minutes at a room temperature to remove the residual solution components.

The service life (T50@100 nits~hrs) of the QLEDs manufactured in the third, fourth and fifth embodiments and the first and second comparative examples were tested respectively, and the results are shown in Table 2 below.

TABLE 2

| service life of device (h) | vacuum degree (Pa) | | |
|---|---|---|---|
| | 8 | 40 | 100 |
| third embodiment | 436 | | |
| fourth embodiment | | 394 | |
| fifth embodiment | | | 382 |
| second comparative example | | 379 | |

It can be seen from the above Table 2 that when the solvent is removed by vacuumizing under a certain condition, the service life of the QLED can be improved.

The above description has only described optional embodiments of the present application, and is not used to limit the present application. For those skilled in the art, the present application may be provided with various modifications and changes. Any modification, equivalent replacement, and improvement, etc. made within the spirit and principle of the present application shall be included in the scope of the claims of the present application.

What is claimed is:

1. A QLED manufacturing method, comprising the following steps of:

providing a substrate provided with an electron transport layer, wherein the substrate provided with the electron transport layer comprises: an anode substrate, a quantum dot light emitting layer provided on the anode substrate, and the electron transport layer provided on a side of the quantum dot light emitting layer facing way from the anode substrate; wherein the substrate provided with the electron transport layer further comprises a cathode substrate, and the electron transport layer is provided on the cathode substrate;

depositing a solution on a surface of the electron transport layer, standing until the electron transport layer is infiltrated by the solution, and then performing a drying operation, wherein the solution comprises a main solvent and a solute dissolved in the main solvent, a polarity of the solute is greater than a polarity of the main solvent, and the solution is not able to dissolve an electron transport material in the electron transport layer.

2. The QLED manufacturing method according to claim 1, wherein the main solvent is selected from one or more than two of a group comprising alkanes and their derivatives with a carbon atom number less than 20 in a straight chain, cycloalkanes and their derivatives with a carbon atom number less than 20, olefins and their derivatives with a carbon atom number less than 20 in a straight chain, and esters and their derivatives with a carbon atom number less than 20 in a straight chain.

3. The QLED manufacturing method according to claim 2, wherein the main solvent selected from alkanes and their derivatives with the carbon atom number less than 20 in the straight chain is selected from one or more of n-hexane, n-heptane, 1-octane, 3-methylheptane and 1-chlorohexane.

4. The QLED manufacturing method according to claim 2, wherein the cycloalkane and their derivatives with the carbon atom number less than 20 are selected from one or more of cyclohexane, 2-methylcyclohexane, cycloheptane and cyclohexylacetic acid.

5. The QLED manufacturing method according to claim 2, wherein the esters and their derivatives with the carbon atom number less than 20 in the straight chain are selected from one or more of ethyl acetate, ethyl butyrate, and ethyl mandelate.

6. The QLED manufacturing method according to claim 2, wherein the olefins and their derivatives with the carbon atom number less than 20 in the straight chain are selected from one or more of 3-hexene, 4-octene, 5-decene, 5-methyl-5-decene and 9-octadecenoic acid.

7. The QLED manufacturing method according to claim 1, wherein, the solute is selected from one or more than two of a group of mercaptans with a carbon atom number less than 20 in a straight chain, organic acids with a carbon atom number less than 15 in a straight chain, halogenated hydrocarbons with a carbon atom number less than 20 in a straight chain, amino acids and organic bases.

8. The QLED manufacturing method according to claim 7, wherein the mercaptans with the carbon atom number less than 20 in the straight chain are selected from one or more of butanethiol, pentanethiol, heptanethiol, octanethiol, and octadecanethiol.

9. The QLED manufacturing method according to claim 7, wherein the organic acids and their derivatives with the carbon atom number less than 15 in the straight chain are selected from one or more of tetradecanoic acid, perfluorooctanoic acid, perchloro-decyl carboxylic acid and perfluorododecanoic acid.

10. The QLED manufacturing method according to claim 7, wherein the halogenated hydrocarbons with the carbon atom number less than 20 in the straight chain are selected from one or more of 1-fluoropropane, 1-chlorobutane, 1-chlorohexane and 3-fluorohexane.

11. The QLED manufacturing method according to claim 7, wherein the amino acids are selected from one or more of glycine, serine, cysteine, and isoleucine.

12. The QLED manufacturing method according to claim 7, wherein the organic bases are selected from one or more of ethanolamine, diethanolamine, triethanolamine, and tetramethylammonium hydroxide.

13. The QLED manufacturing method according to claim 1, wherein based on a total weight of the solution being 100%, a weight percentage of the solute is from 0.0001% to 1%.

14. The QLED manufacturing method according to claim 13, wherein based on the total weight of the solution being 100%, the weight percentage of the solute is from 0.0001% to 0.5%.

15. The QLED manufacturing method according to claim 1, wherein the solution is deposited on the surface of the electron transport layer, and the standing is performed under a condition where a temperature is from 10° C. to 1860° C. until the electron transport layer is infiltrated, and then the drying operation is performed.

16. The QLED manufacturing method according to claim 1, wherein the solution is deposited on the surface of the electron transport layer, and the standing is performed until the electron transport layer is infiltrated, and then the drying operation is performed by vacuumizing.

17. The QLED manufacturing method according to claim 16, wherein the vacuumizing is performed under a condition of a vacuum degree of 8 Pa-200 Pa.

18. The QLED manufacturing method according to claim 1, wherein the solution is deposited on the surface of the electron transport layer, and the standing is performed for 10 minutes to 100 minutes until the electron transport layer is infiltrated, and then the drying operation is performed.

19. The QLED manufacturing method according to claim 1, wherein the method further comprises a step of preparing a hole functional layer on a surface of the anode substrate, wherein the hole functional layer comprises at least one of a hole injection layer, a hole transport layer and an electron blocking layer.

20. The QLED manufacturing method according to claim 1, wherein before preparing the electron transport layer, at least one of an electron injection layer and a hole blocking layer is prepared on a surface of the cathode.

* * * * *